(12) United States Patent
Lin

(10) Patent No.: US 7,764,200 B2
(45) Date of Patent: Jul. 27, 2010

(54) CAPACITIVE BUTTON DEVICE

(75) Inventor: Yi-Chan Lin, Taipei (TW)

(73) Assignee: Holtek Semiconductor Inc., Hsinchu (TW)

( * ) Notice: Subject to any disclaimer, the term of this patent is extended or adjusted under 35 U.S.C. 154(b) by 329 days.

(21) Appl. No.: 12/123,609

(22) Filed: May 20, 2008

(65) Prior Publication Data

US 2009/0278714 A1 Nov. 12, 2009

(30) Foreign Application Priority Data

May 12, 2008 (TW) .............................. 97117369 A

(51) Int. Cl.
*H03M 7/00* (2006.01)
(52) U.S. Cl. .................. 341/50; 341/172; 341/155; 341/144; 341/161
(58) Field of Classification Search ............... 341/50, 341/51, 161, 155, 144, 172
See application file for complete search history.

(56) References Cited

U.S. PATENT DOCUMENTS

| | | | | |
|---|---|---|---|---|
| 4,142,185 A | * | 2/1979 | Gordon | 341/138 |
| 6,271,784 B1 | * | 8/2001 | Lynn et al. | 341/150 |
| 6,369,744 B1 | * | 4/2002 | Chuang | 341/161 |
| 6,441,765 B1 | * | 8/2002 | Aram | 341/155 |
| 6,545,628 B1 | * | 4/2003 | Aram | 341/155 |
| 6,570,516 B1 | * | 5/2003 | Barker | 341/122 |
| 7,009,549 B1 | * | 3/2006 | Corsi | 341/161 |
| 7,129,882 B2 | * | 10/2006 | Yukawa | 341/163 |

* cited by examiner

*Primary Examiner*—Jean B Jeanglaude
(74) *Attorney, Agent, or Firm*—WPAT, PC; Justin King

(57) ABSTRACT

The present invention discloses a capacitive button device, comprising: a signal input unit, a first amplifier, a first switching unit, a second amplifier, a second switching unit, an analog-to-digital converting unit, a third switching unit, a data output unit, a data storage unit and a digital-to-analog converting unit. Thereby, the present invention overcomes the problem due to poor resolution of conventional capacitive buttons and can be used with touch panels. Moreover, the digital-to-analog converting unit is downsized with improved resolution and reduced cost in design and fabrication.

7 Claims, 6 Drawing Sheets

CAPACITIVE BUTTON DEVICE

BACKGROUND OF THE INVENTION

1. Field of the Invention

The present invention generally relates to a capacitive button device and, more particularly, to a capacitive button device capable of improving the resolution of capacitive buttons.

2. Description of the Prior Art

Please refer to FIG. 1 and FIG. 2, wherein FIG. 1 is a block diagram of a conventional capacitive button device and FIG. 2 shows how the signal changes when a conventional capacitive button device is touched. When a finger touches a printed circuit board (PCB) or a glass substrate 2 during a signal transmission process conducted by a signal transmitting device 1, part of the transmitted charges are introduced through the finger, while the other charges are transmitted in two paths. In one path, the charges are directly coupled to the integrating and amplifying device 3; and in the other path, the charges are radiated into the air. The charges coupled to the integrating and amplifying device 3 generate a permanent base for the button device. The permanent base is about 80% to 90% of the untouched coupled potential. In other words, the change is only 10% to 20% after the capacitive touch device is touched. Meanwhile, only 10% to 20% of the bit order can be effectively used after the signal is processed by a digital-to-analog converting unit.

In the conventional capacitive button device, the transmitted signal is coupled to the integrating and amplifying device 3 through an equivalent capacitance formed by the PCB or the glass substrate 2 before it is converted by an analog-to-digital converting unit 4 into a digital data to be stored in a data storage unit 5. The digital data is then output and identified by a data output unit 6. When a capacitive button is touched, part of the charges in the integrated signal are introduced through the finger that touched the capacitive button so that the potential of the integrated signal drops. The charges introduced through the finger cause the potential to drop by 10% to 20%, while the remained 80% to 90% of the signal processed by the analog-to-digital converting unit 4 will not change. The resolution of touch response is only 10% to 20% of the analog-to-digital converting unit 4. Therefore, if the analog-to-digital converting unit 4 is be to used, the permanent base, which is 80% to 90% of the signal, has to be deducted so that only the change of the signal is processed by the analog-to-digital converting unit 4 to improve the resolution.

Accordingly, the conventional capacitive button device is problematic in:

1. poor resolution of the buttons;
2. large hardware size and high manufacturing cost; and
3. restriction in use for general control buttons only.

Therefore, there exists a need in providing a capacitive button device capable of improving the resolution of conventional capacitive buttons and being used with touch panels to downsize the digital-to-analog converting unit with improved resolution and reduced cost in design and fabrication.

SUMMARY OF THE INVENTION

It is one object of the present invention to provide a capacitive button device capable of improving the resolution of capacitive buttons.

In order to achieve the foregoing object, the present invention provides a capacitive button device, comprising: a signal input unit for inputting a voltage signal; a first amplifier having a positive input terminal coupled to the signal input unit to receive the voltage signal and a negative input terminal coupled to a reference voltage; a first switching unit having an input terminal coupled to an output terminal of the first amplifier; a second amplifier having a negative input terminal coupled to an output terminal of the first switching unit; a second switching unit having an input terminal coupled to another output terminal of the first switching unit and another input terminal coupled to an output terminal of the second amplifier; an analog-to-digital converting unit having an input terminal coupled to an output terminal of the second switching unit; a third switching unit having an input terminal coupled to an output terminal of the analog-to-digital converting unit; a data output unit coupled to an output terminal of the third switching unit; a data storage unit having an input terminal coupled to another output terminal of the third switching unit; and a digital-to-analog converting unit having an input terminal coupled to an output terminal of the data storage unit and an output terminal coupled to a positive input terminal of the second amplifier.

These and other features, aspects, and advantages of the present invention will become better understood with reference to the following description and claims.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE PREFERRED EMBODIMENT

The present invention can be exemplified by the preferred embodiment as described hereinafter.

Figure 1:
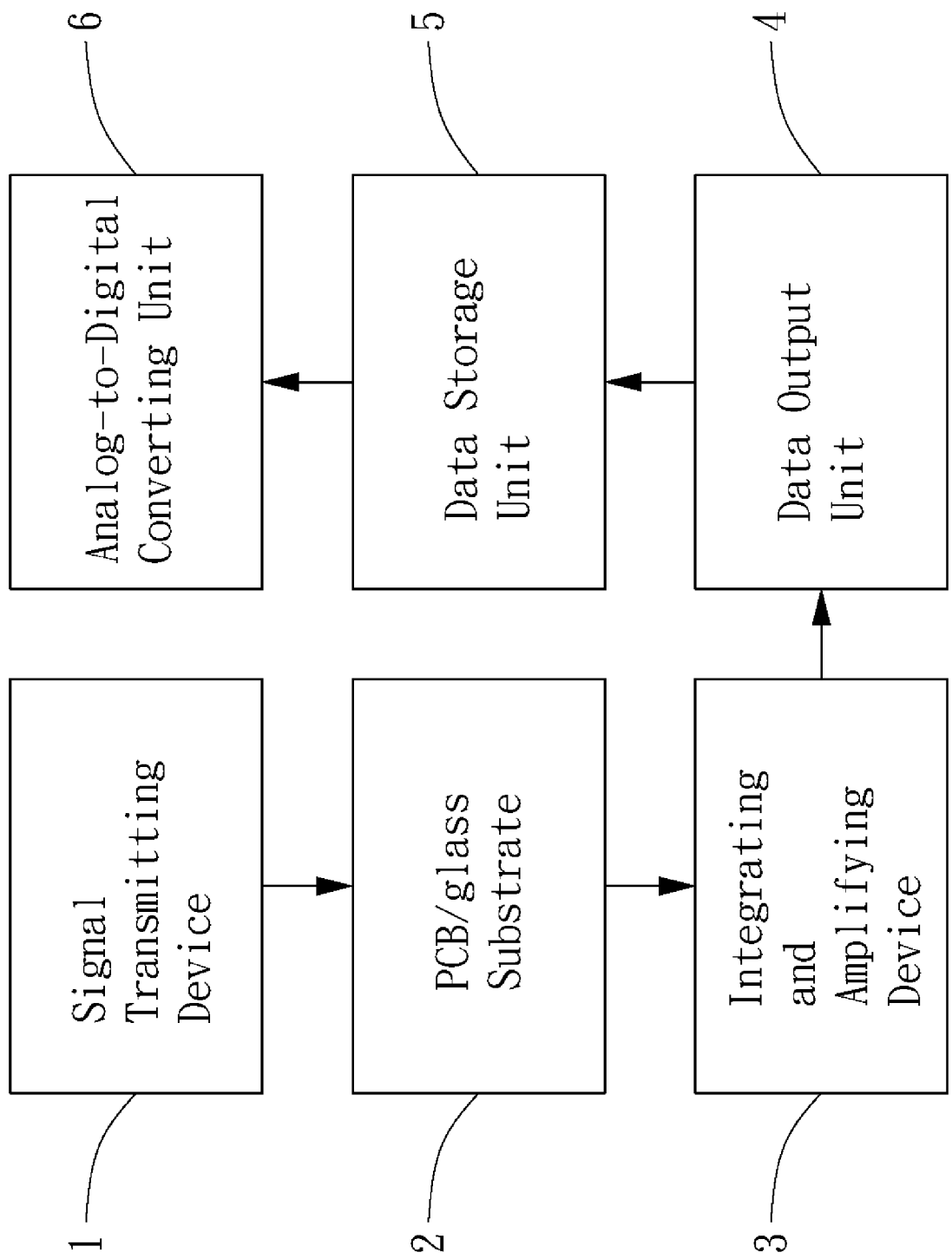
FIG. 1 is a block diagram of a conventional capacitive button device.
Figure 2:
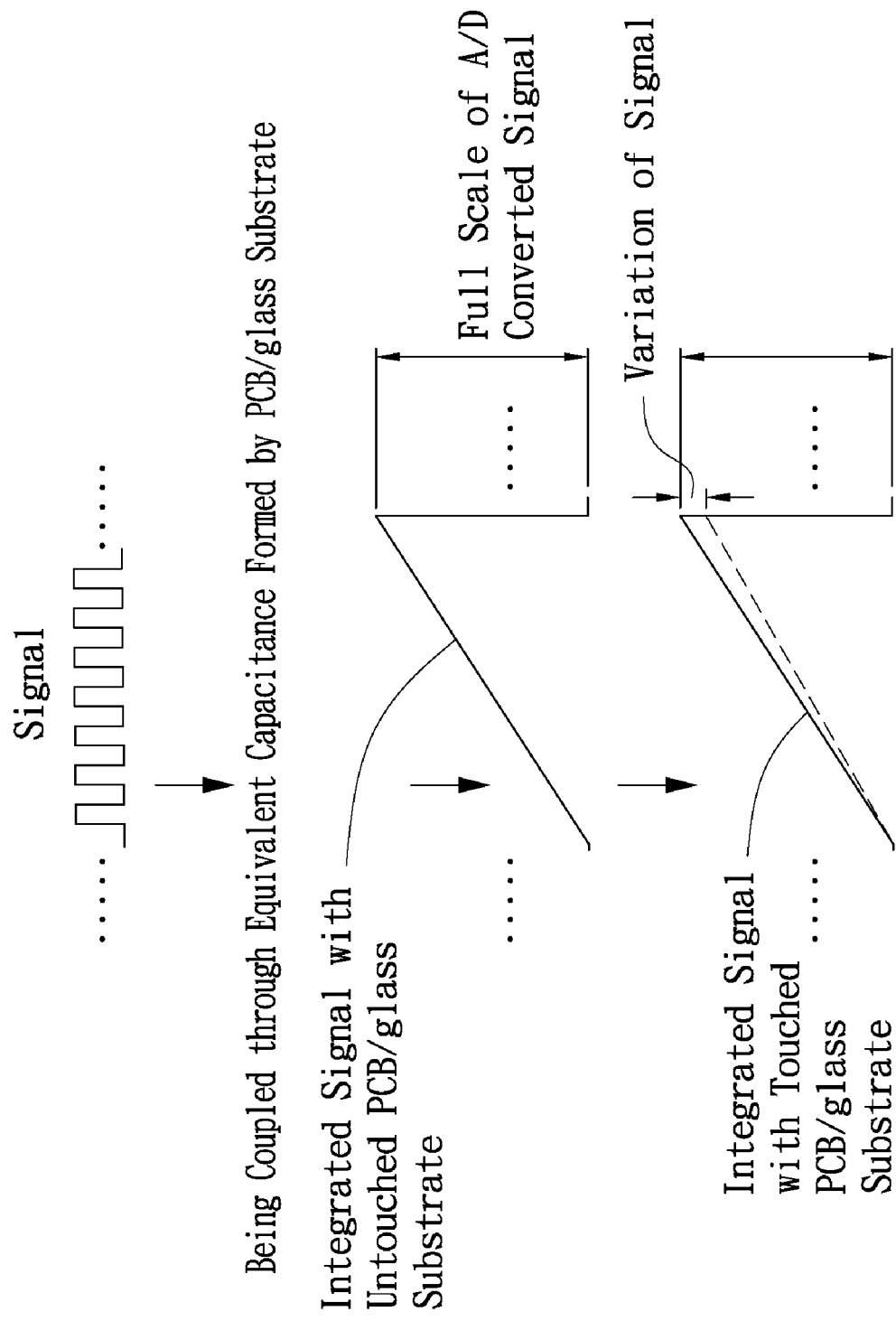
FIG. 2 shows how the signal changes when a conventional capacitive button device is touched.
Figure 3:
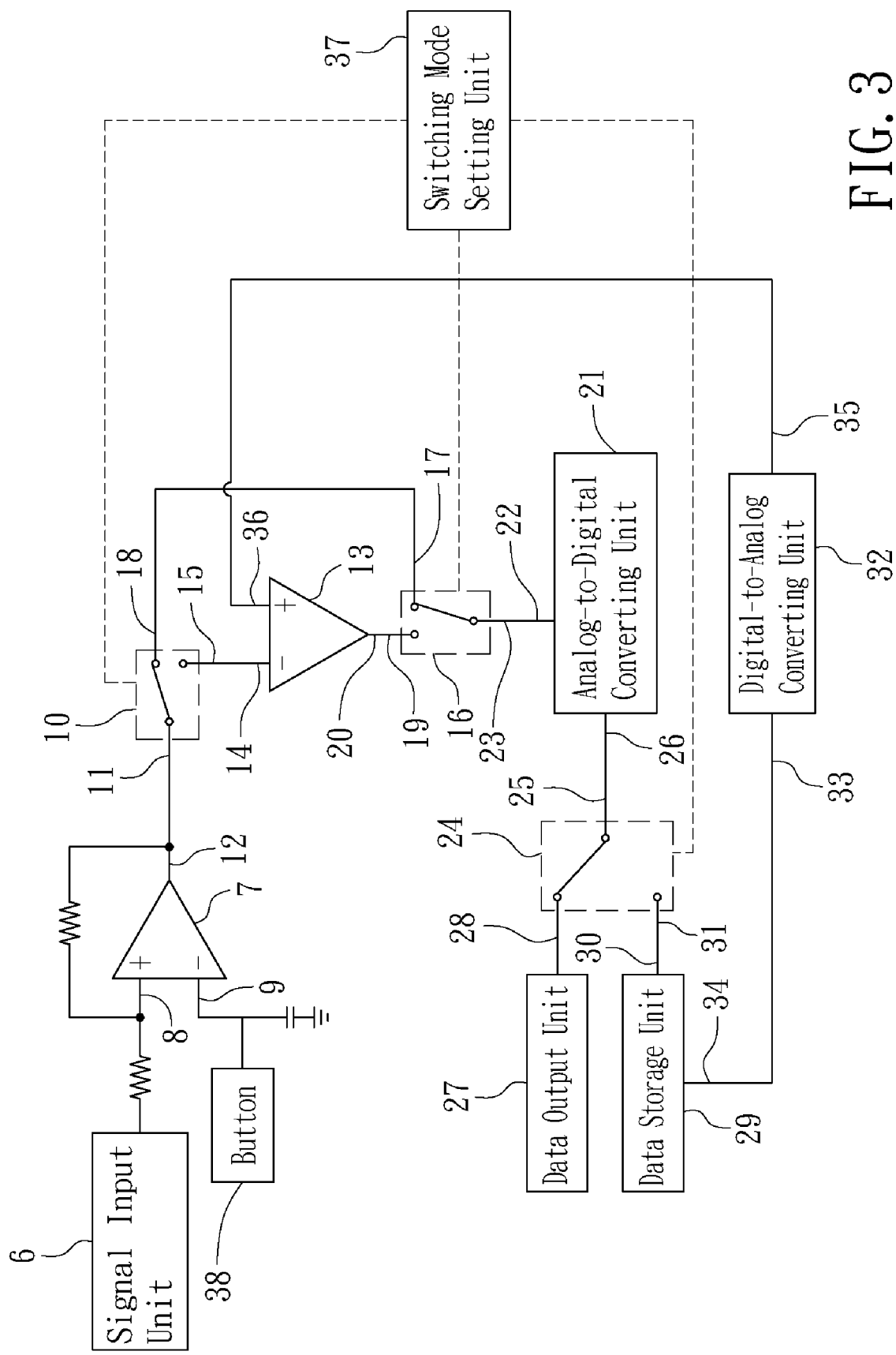
FIG. 3 is a circuit diagram of a capacitive button device according to the preferred embodiment of the present invention.

Please refer to FIG. 3, which is a circuit diagram of a capacitive button device according to the preferred embodiment of the present invention. The capacitive button device of the present invention comprises: a signal input unit 6 for inputting a voltage signal; a first amplifier 7 having a positive input terminal 8 coupled to the signal input unit 6 to receive the voltage signal and a negative input terminal 9 coupled to a reference voltage; a first switching unit 10 having an input terminal 11 coupled to an output terminal 12 of the first amplifier 7; a second amplifier 13 having a negative input terminal 14 coupled to an output terminal 15 of the first switching unit 10; a second switching unit 16 having an input terminal 17 coupled to another output terminal 18 of the first switching unit 10 and another input terminal 19 coupled to an output terminal 20 of the second amplifier 13; an analog-to-digital converting unit 21 having an input terminal 22 coupled to an output terminal 23 of the second switching unit 16; a third switching unit 24 having an input terminal 25 coupled to an output terminal 26 of the analog-to-digital converting unit 21; a data output unit 27 coupled to an output terminal 28 of the third switching unit 24; a data storage unit 29 having an input terminal 30 coupled to another output terminal 31 of the third switching unit 24; and a digital-to-analog converting unit 32 having an input terminal 33 coupled to an output terminal 34 of the data storage unit 29 and an output terminal 35 coupled to a positive input terminal 36 of the second amplifier 13.

Figure 4:
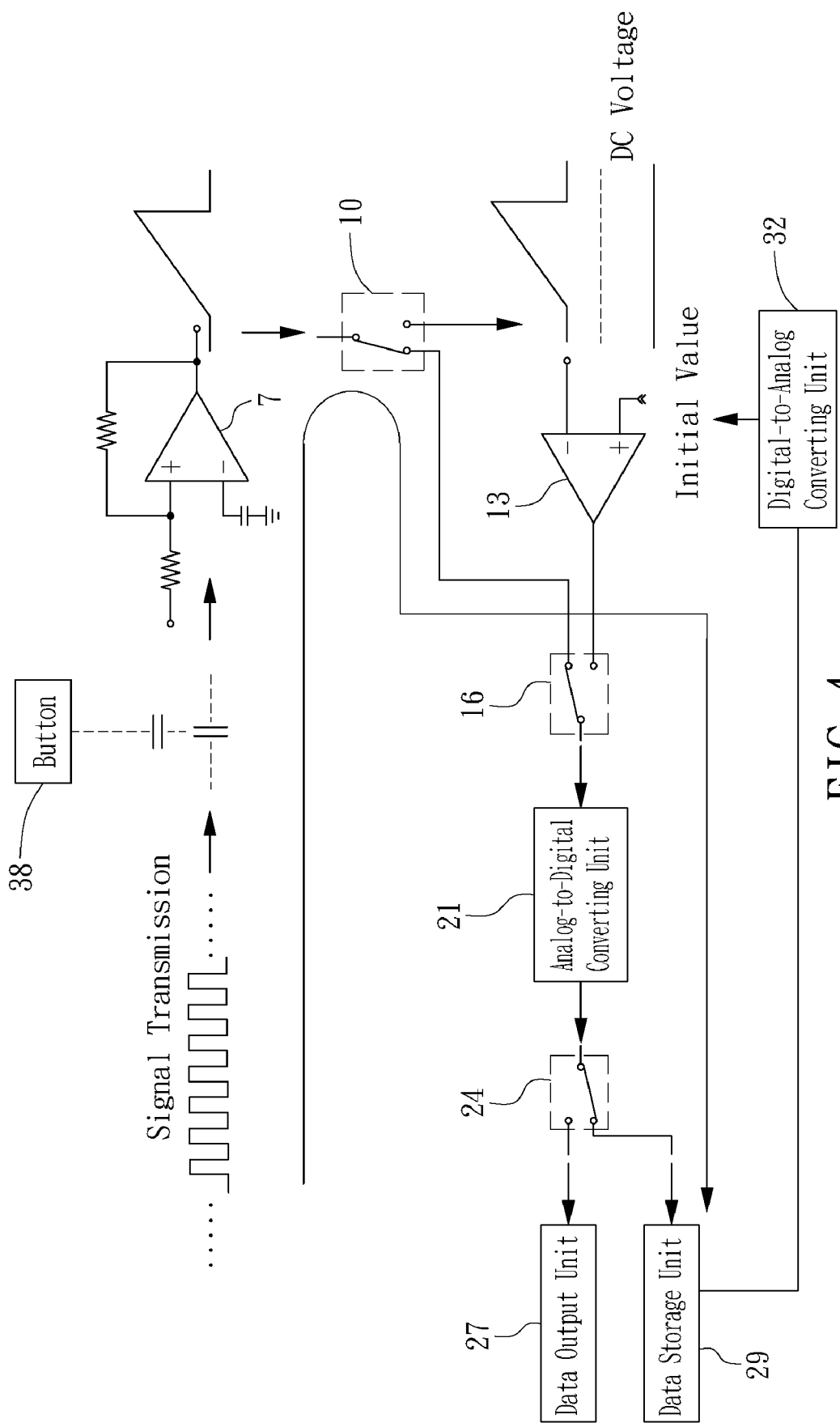
FIG. 4 is a circuit diagram of a capacitive button device with the signal therein in a data storage mode according to the present invention.
Figure 5:
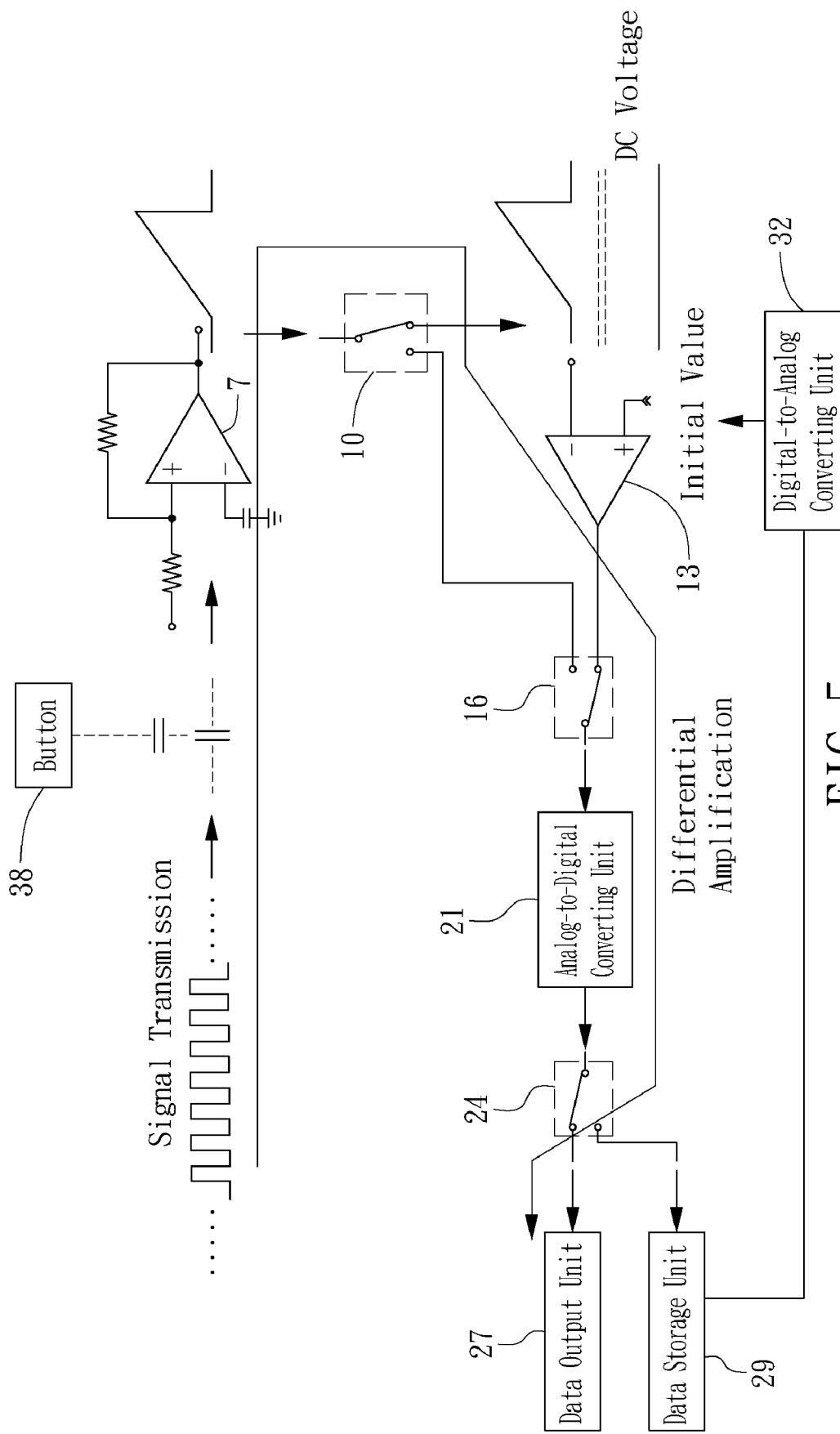
FIG. 5 is a circuit diagram of a capacitive button device with the signal therein in a data output mode according to the present invention.
Figure 6:
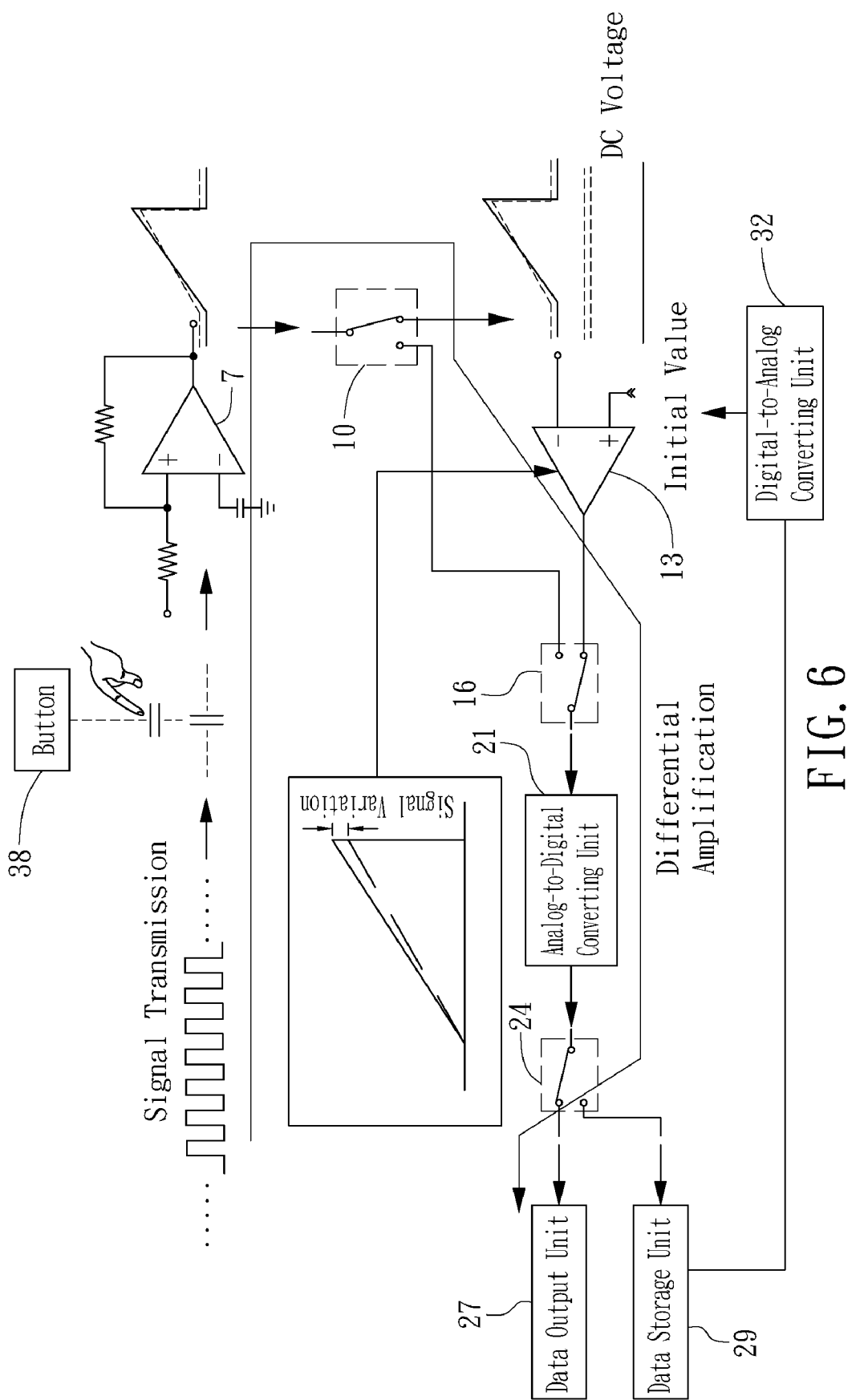
FIG. 6 is a circuit diagram of a capacitive button device and the signal state when one of the capacitive buttons is touched according to the present invention.

Please refer to FIG. 4 to FIG. 6 and FIG. 3. FIG. 4 is a circuit diagram of a capacitive button device with the signal therein in a data storage mode according to the present invention; FIG. 5 is a circuit diagram of a capacitive button device with the signal therein in a data output mode according to the present invention; and FIG. 6 is a circuit diagram of a capacitive button device and the signal state when one of the capacitive buttons is touched according to the present invention. Preferably, the capacitive button device of the present invention further comprises a switching mode setting unit 37 to control switching modes for the first switching unit 10, the second switching unit 16 and the third switching unit 24. The switching modes comprise a data storage mode and a data output mode. When the capacitive button device is reset, the switching mode is set to be a data storage mode (as shown in FIG. 4). The first switching unit 10 and the second switching unit 16 are turned on and the third switching unit 24 enables the first amplifier 7, the analog-to-digital converting unit 21 and the data storage unit 29 to be electrically connected. After the initial data is stored, the switching mode is set to be a data output mode (as shown in FIG. 5). The first switching unit 10 and the second switching unit 16 are turned on and the third switching unit 24 enables the first amplifier 7, the second amplifier 13 and the data output unit 27 to be electrically connected. Then, when the user touches the button 38 to change the waveform of the integrated signal, the difference between the highest level and the base is amplified. The rate of change is then processed by the analog-to-digital converting unit 21 to determine the resolution (as shown in FIG. 6).

In the present invention, the permanent base, which is 80% to 90% of the total charges, is deducted before digital signal processing performed by the analog-to-digital converting unit. Therefore, only the change of the signal due to the touch on the capacitive button device is processed by the analog-to-digital converting unit 4 to improve the resolution.

Accordingly, the present invention discloses a capacitive button device capable of improving the resolution of conventional capacitive buttons and being used with touch panels to downsize the digital-to-analog converting unit with improved resolution and reduced cost in design and fabrication. Therefore, the present invention is novel, useful and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A capacitive button device, comprising:
a signal input unit for inputting a voltage signal;
a first amplifier having a positive input terminal coupled to the signal input unit to receive the voltage signal and a negative input terminal coupled to a reference voltage;
a first switching unit having an input terminal coupled to an output terminal of the first amplifier;
a second amplifier having a negative input terminal coupled to an output terminal of the first switching unit;
a second switching unit having an input terminal coupled to another output terminal of the first switching unit and another input terminal coupled to an output terminal of the second amplifier;
an analog-to-digital converting unit having an input terminal coupled to an output terminal of the second switching unit;
a third switching unit having an input terminal coupled to an output terminal of the analog-to-digital converting unit;
a data output unit coupled to an output terminal of the third switching unit;
a data storage unit having an input terminal coupled to another output terminal of the third switching unit; and
a digital-to-analog converting unit having an input terminal coupled to an output terminal of the data storage unit and an output terminal coupled to a positive input terminal of the second amplifier.

2. The capacitive button device as recited in claim 1, wherein a resistor is disposed between the negative input terminal and the output terminal of the first amplifier, and the positive input terminal of the first amplifier is grounded through a capacitor connected in series to form an integrating amplifier.

3. The capacitive button device as recited in claim 1, wherein the second amplifier is a differential amplifier.

4. The capacitive button device as recited in claim 1, further comprising a switching mode setting unit to control switching modes for the first switching unit, the second switching unit and the third switching unit.

5. The capacitive button device as recited in claim 4, wherein the switching modes comprise a data storage mode and a data output mode.

6. The capacitive button device as recited in claim 5, wherein the first switching unit and the second switching unit are turned on and the third switching unit enables the first amplifier, the analog-to-digital converting unit and the data storage unit to be electrically connected when the switching mode is the data storage mode.

7. The capacitive button device as recited in claim 5, wherein the first switching unit and the second switching unit are turned on and the third switching unit enables the first amplifier, the second amplifier and the data output unit to be electrically connected when the switching mode is the data output mode.

* * * * *